United States Patent [19]

Shimada et al.

[11] 4,024,564

[45] May 17, 1977

[54] SEMICONDUCTOR DEVICE HAVING AT LEAST ONE PN JUNCTION AND CHANNEL STOPPER SURROUNDER BY A PROTECTIVE CONDUCTING LAYER

[75] Inventors: Takashi Shimada, Yamoto; Shinishi Saiki, Zama; Akio Kayanuma, Odawara, all of Japan

[73] Assignee: Sony Corporation, Tokyo, Japan

[22] Filed: Aug. 13, 1975

[21] Appl. No.: 604,093

[30] Foreign Application Priority Data

Aug. 19, 1974 Japan .............................. 49-94820

[52] U.S. Cl. .................................... 357/53; 357/52; 357/15; 357/68

[51] Int. Cl.$^2$ .................. H01L 29/34; H01L 29/40; H01L 29/48; H01L 29/56

[58] Field of Search .................. 357/52, 53, 68, 15

[56] References Cited

UNITED STATES PATENTS

| | | | |
|---|---|---|---|
| 3,283,170 | 11/1966 | Buie | 357/52 |
| 3,601,668 | 8/1971 | Slaten | 357/52 |
| 3,684,933 | 8/1972 | Schulz et al. | 357/52 |
| 3,694,705 | 9/1972 | Wenzig | 357/52 |
| 3,751,722 | 8/1973 | Richman | 357/52 |
| 3,760,241 | 9/1973 | Epple | 357/15 |

OTHER PUBLICATIONS

Extract from Texas Instrument Booklet, New Products Review for Wescon, 1964.

*Primary Examiner*—Andrew J. James
*Attorney, Agent, or Firm*—Hill, Gross, Simpson, Van Santen, Steadman, Chiara & Simpson

[57] ABSTRACT

A semiconductor device is disclosed which has a first semiconductor layer of one conductivity type and low impurity concentration, a second semiconductor region of the opposite conductivity type forming a PN junction with the first semiconductor layer, a third semiconductor region of the first mentioned conductivity type formed in the first semiconductor layer which surrounds the PN junction and forms an LH junction with the first semiconductor layer, a passivating layer covering at least the PN and LH junctions, and a conductive layer extending on the passivating layer covering at least the inner periphery of the third region and connected to the first semiconductor layer through an electric barrier layer.

6 Claims, 8 Drawing Figures

E
B
10
9
7
5c
5b
5e
6e
6b
4
7
9
1a
N+
P+
P+
N+
P+
1b
J
N
3
Je
P−
Jc
1
20
P+
2
C 5c
5b
5e
7a
Je
6b
Jc
6e
1

E
B
10
7
9
5c
5b
5e
6e
6b
4
9
7
d
10
1a
P+
N+
P+
N
P+
N+
1b
J
Je
P−
Jc
J
3
1
20
P+
2
C

E
B
7
10
9
5c
5b
5e
6e
6b
4
9
10
7
1a
N+
P
N+
P+
J
J
P+
1b
3
N−
1
20
N+
2
C

K
G
7
10
9
12
11
15K
15G
4
9
10
7
1a
N+
P
N+
P+
J
J
P+
1b
N−
J
20
P
13
14
15A
1c
1
4
A

SEMICONDUCTOR DEVICE HAVING AT LEAST ONE PN JUNCTION AND CHANNEL STOPPER SURROUNDED BY A PROTECTIVE CONDUCTING LAYER

BACKGROUND OF THE INVENTION

1. Field of the Invention

This invention relates generally to an improved semiconductor device, and more particularly to an improved design for semiconductor devices having a plurality of junctions covered with a passivating layer on the surface thereof.

In the semiconductor devices, for example, a so-called planar-type transistor on which an insulating layer such as silicon dioxide $SiO_2$ is deposited, an inversion layer appears at the surface beneath the silicon dioxide layer. When the inversion layer extends from a PN junction to an edge of a semiconductor body, that is, a scribed portion of the semiconductor device, the leakage current across the PN junction increases while the break-down voltage of the PN junction decreases.

2. Description of the Prior Art

Such an improved transistor is known in the art for avoiding the above induced inversion layer that, on the surface of a semiconductor substrate of a low impurity concentration where the inversion layer is apt to be induced, there is provided a ring-shaped region whose conductivity type is same as that of the semiconductor substrate and whose impurity concentration is higher than that of the semiconductor substrate. The ring-shaped region is called generally a channel stopper region or an anti-channel region. The structure of the above transistor will be described later with reference to FIG. 1 in detail.

SUMMARY OF THE INVENTION

According to an aspect of this invention, there is provided an improved semiconductor device which has a channel-stopper region, in which an LH junction (lightly-doped and heavily-doped junction) opposing an active element portion of the channel stopper region is covered through a passivation layer (for example, a silicon dioxide layer) with a conductive layer. The conductive layer is electrically connected through a rectifying junction or an electric barrier to a semiconductor substrate, and the rectifying junction or electric barrier is formed at such a position that the depletion layer in the active element portion does not arrive thereat.

Accordingly, it is an object of the present invention to provide an improved semiconductor device.

It is another object of the invention to provide a semiconductor device which is high in reliability.

It is a further object of the invention to provide a semiconductor device which avoids the defects caused by the provision of a channel stopper.

The additional, and other objects, features and advantages of the invention will become apparent from the following description taken in conjunction with the accompanying drawings through which like reference numerals and letters designate the like elements.

DESCRIPTION OF THE PREFERRED EMBODIMENTS

In a transistor, the leakage current and break-down voltage across a collector junction, which is formed and extended under an insulating layer on the surface of a semiconductor substrate and which is supplied with a bias in the reverse direction, become a problem.

Figure 1:
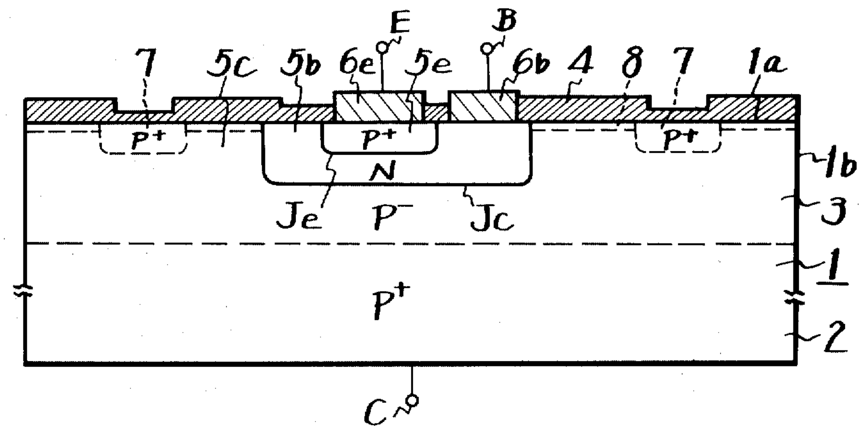
FIG. 1 is a cross-section view of a prior art transistor which has provided with a channel stopper.

As an example of the transistor which avoids the increase of the leakage current across the collector junction and the decrease of the breakdown voltage thereof caused by a parasitic channel, there is proposed such a transistor in the art which is provided with a channel stopper region of a high impurity concentration on the surface of the collector region to surround the same as shown in FIG. 1. The prior art transistor shown in FIG. 1 is a PNP-transistor whose semiconductor body 1 consists of a semiconductor substrate, for example, a silicon substrate 2 of the P-type conductivity and high impurity concentration or low specific resistance and a semiconductor layer, for example, a silicon layer 3 of P-type conductivity and relatively low impurity concentration formed on the silicon substrate 2 by epitaxial growth. On a major surface 1*a* of the semiconductor body 1, there is formed an insulating layer 4 made of such as silicon dioxide $SiO_2$. A base region 5*b* of the N-type conductivity is formed in the body 1 by, for example, a selective diffusion to face its major surface 1*a* and an emitter region 5*e* of the P-type conductivity is formed by, for example, a selective diffusion in a part of the base region 5*b*. A part of the body 1 outside the base region 5*b* serves as a collector region 5*c*. In FIG. 1, reference letters J*e* and J*c* designate an emitter junction and a collector junction, respectively. On the base region 5*b* and the emitter region 5*e*, there are provided a base electrode 6*b* and an emitter electrode 6*e* in ohmic contact with the former, respectively, and a base terminal B and an emitter terminal E are led out from the base and collector electrodes 6*b* and 6*e*, respectively. A collector terminal C is led out from, for example, the substrate 2 of high impurity concentration. A channel stopper region 7 is formed in the outside region or collector region 5*c* from the major surface 1*a* to surround the collector junction $J_c$ extended to the major surface 1*a*, the collector region 5*c* forming the collector junction $J_c$ with the base region 5*b*. The conductivity type of the region 7 is same as that of the collector region 5*c* but the impurity concentration of the region 7 is selected much higher than that of the low impurity concentration region portion adjacent the junction $J_c$ of the collector region 5*c* or the semiconductor layer 3. The region 7 is formed by a selective diffusion from the major surface 1*a*.

With the above construction of transistor, since no parasitic channel appears on the channel stopper region 7 of high impurity concentration, even if an inverse layer is caused under the insulating layer 4 on the surface of the collector region 5*c* of low impurity concentration to cause the formation of a parasitic channel 8, the parasitic channel 8 is cut by the channel stopper region 7 of high impurity concentration. As a result, it is avoided that the parasitic channel 8 is extended continuously from the surface of the collector junction $J_C$ to a side 1*b* (cross-section) of the body 1 and hence that the leakage current across the collector junction $J_c$ increased and the break-down voltage thereof decreases caused by the parasitic channel 8.

When the above prior art transistor with the channel stopper are subject to the BT treatment (bias-temperature treatment) which is one of reliability tests, for example, to a BT treatment in which the bias voltage of 100V (volts) is applied to the collector junction of the transistors at 120° C, a leakage current increases remarkably in some of them.

The inventors of the present invention carried out various experiments and found that, in the prior art transistors in which the leakage current increases during the BT treatment, a special condition (which will be referred to as a leakage current generation cause) exists locally in the channel stopper region. After discussing the leakage current generation cause, the inventors of the invention provide a novel semiconductor device which prevents the increase of any leakage current during the BT treatment and whose break-down voltage is made high.

Figure 2:
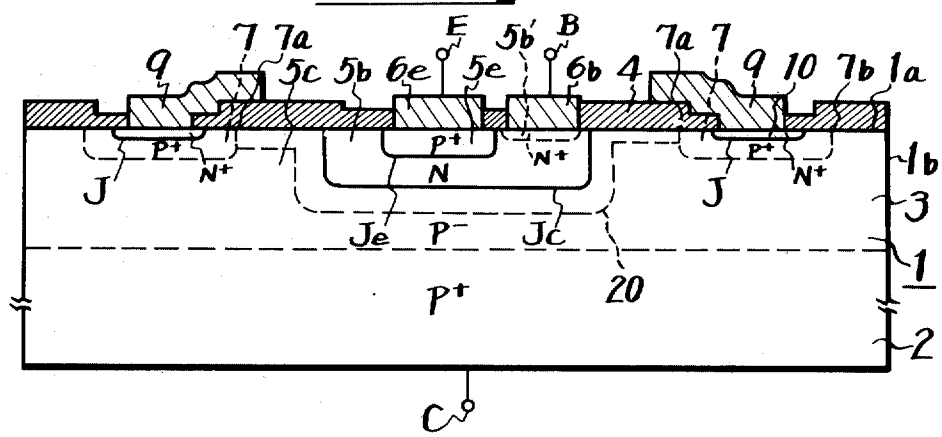
FIG. 2 is a cross-sectional view of an embodiment of the semiconductor device according to the present invention.
Figure 3:
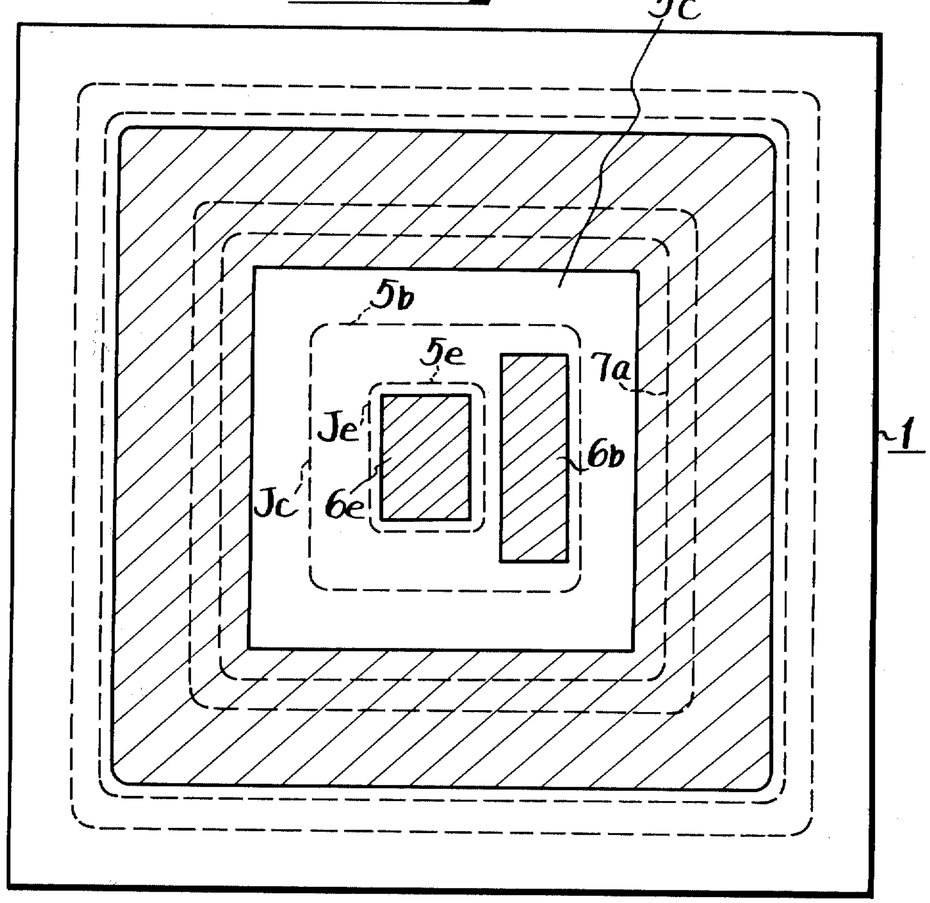
FIG. 3 is a plan view of the semiconductor device shown in FIG. 2.

With reference to FIGS. 2 and 3, an embodiment of the present invention, which is formed as a PNP-transistor, will be now described. In the Figures, the parts corresponding to those of FIG. 1 are marked with the same reference numerals and letters and their description will be omitted for the sake of brevity. As shown in FIG. 2, the channel stopper region 7 is also provided in the embodiment of the invention at the same time as the forming of the emitter region 5*e* in such a manner that an impurity of the same conductivity as that of the collector region 5*c* is selectively diffused into the outside region or the collector region 5*c* of low impurity concentration, which is a substrate region and surrounds the PN-junction or the collector junction $J_c$ in the illustrated example extended to the major surface 1*a* of the semiconductor body 1 to prevent the leakage current.

Figure 4:
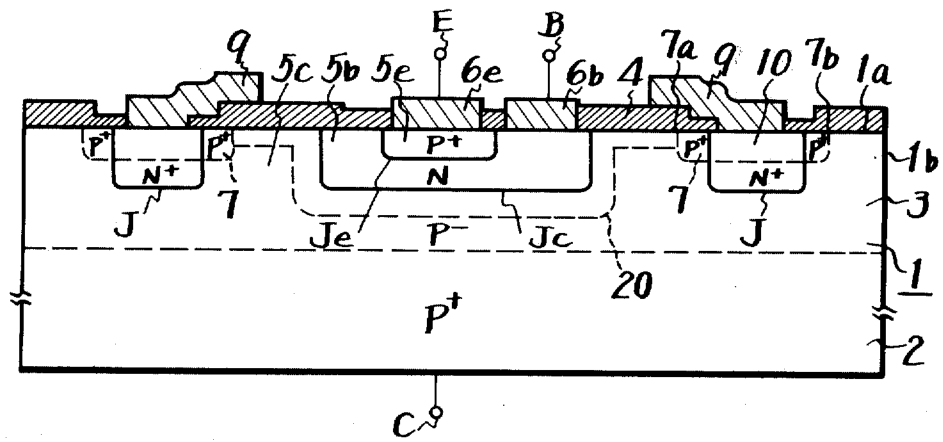
FIGS. 4 to 8, inclusive, are respectively cross-sectional views of other embodiments of the invention.

In the example of the invention, on the inner periphery or inner edge 7*a* of the channel stopper region 7 facing the collector junction $J_c$, there is formed an electrode 9 for preventing the leakage current which covers through the insulating layer 4 the portion of the region 7 and that of the collector region 5*c* surrounded by the region 7 continuously. In this case, the electrode 9 exists on the whole extension of the edge 7*a* facing the major surface 1*a* or to surround the collector junction $J_c$. The electrode 9 is electrically connected to the substrate or the collector region 5*c* through a rectifying barrier layer as a required electric barrier, for example, a PN-junction J. To this end, an impurity of the different type conductivity from that of the channel stopper region 7 or the N-type conductivity is selectively diffused into a part of the region 7 to form a region 10 and hence to form the PN-junction J between the regions 7 and 10. The outer periphery of the electrode 9 is connected to the region 10 in ohmic contact. At the same time of the formation of the region 10 by diffusion, a region 5*b'* of high impurity concentration with the conductivity same as that of the base region 5*b* is formed by diffusion in a part thereof which serves an an electrode contact portion. The region 10, to which the electrode 9 is connected in ohmic contact, is required to be located at such a position that the depletion layer induced by the collector junction $J_c$ may not arrive thereat and can be formed along the extension of the channel stopper region 7 on the surface 1*a* or as ring-shaped, as shown in FIG. 3. However, parts of the region 10 can be formed as island regions. In the example shown in FIGS. 2 and 3, the region 10 is formed not deeper than the channel stopper region 7, but the region 10 can be formed deeper than the region 7 as shown in FIG. 4. In FIGS. 2 to 8, the depletion layer produced by the collector junction $J_c$ is shown by dotted lines 20, respectively.

Figure 5:
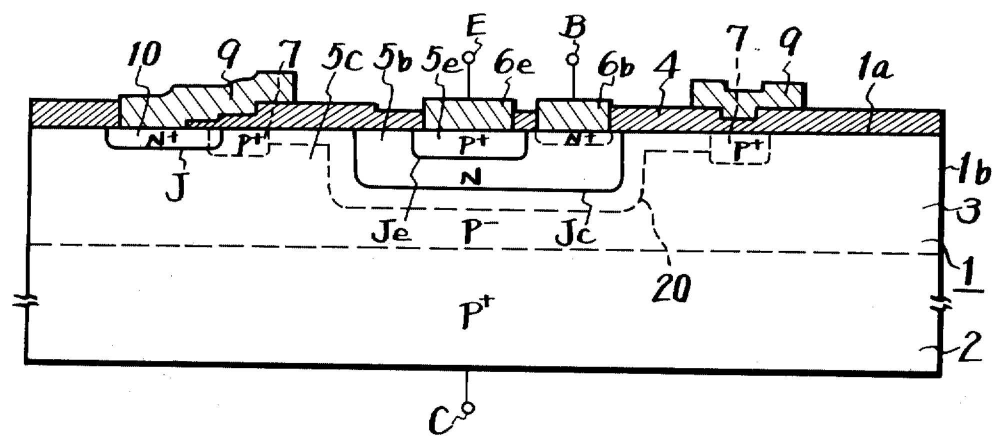

Further, the region 10 can be formed such that it contacts with or overlaps partially on the outside of the region 7 and extends therefrom outwardly as shown in FIG. 5. In the embodiment of FIG. 5, the region 10 is formed not as a ring-shaped one but as an island regions partially. If the region 10 is formed as island regions, they can be formed at the corners of a semiconductor pellet. Therefore, the space occupied thereby can be spared and hence the surface area of the semiconductor device can be reduced.

Figure 6:
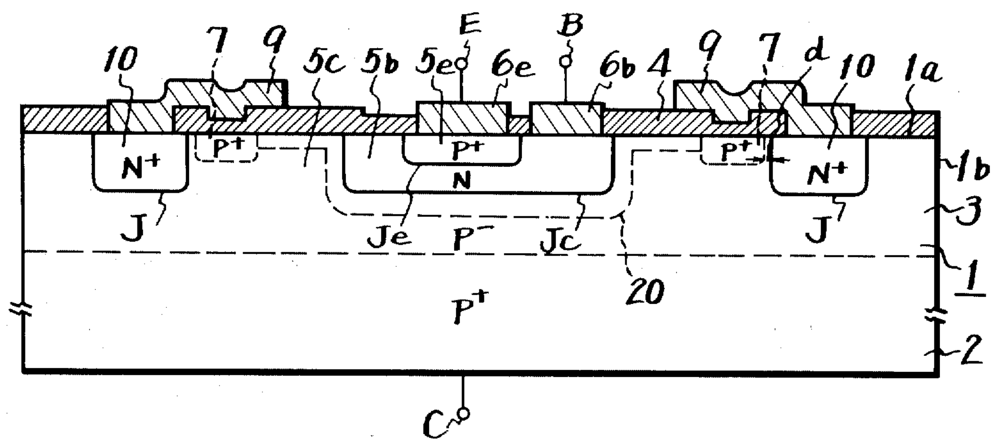

Further, as shown in FIG. 6, the region 10 can be formed at the outside of the region 7 with a predetermined distance *d* from the outside thereof.

With the present invention described above, it is ascertained that even if the semiconductor device is subjected to the BT treatment, the increase of the leakage current can be avoided, it being considered that the electrode 9 has an effect to prevent the leakage current generation cause in the channel stopper region 7 and any parasitic channel is prevented from being induced in the collector region 5*c* of low impurity concentration under the electrode 9.

In other words, in the present invention described above since the electrode 9 extends to surround the outer side of the surface of the collector junction $J_c$ above the channel storage region 7 and the part surrounded by the region 7; the electrode 9 can prevent ions, for example, sodium ions (though not shown, the surface of the semiconductor substrate is covered with a resin by molding for protection of the semiconductor substrate and hence sodium ions are induced in the resin) from being introduced into the insulating layer 4 under the electrode 9 during the BT treatment; accordingly the formation of a parasitic channel caused by electric charges produced by the introduction of the ions thereinto is prevented from being helped; the leakage current generation cause is prevented from being assisted; and the electrode 9 is connected electrically to the region 10 on the collector region 5*c*, the electrode 9 is supplied with a potential nearly same as that applied to the collector region 5*c*. As a result, it is difficult that the inverse layer and hence parasitic channel appear in the surface of the region 5*c* under the electrode 9. Accordingly, even if a parasitic channel appears in the surface of the region 5*c* extending outwardly from the collector junction $J_c$, the parasitic channel never arrive at the leakage current generation point. Therefore, it may be avoided that a leakage current appears across the base-collector therethrough.

Further, in the examples of the invention since the electrode 9 exists on the surface of the body 1 relatively close to the base electrode 6*b*, the discharge between the electrodes 6*b* and 9 may propose a problem in some cases. However, in the invention the PN-junction J exists between the electrode 9 and the substrate region or the collector region 5*c*, so that by suitably selecting its break-down voltage the above discharge can be avoided. When the region 10 is formed adjacent the channel region 7 of high impurity concentration, the junction J is formed between the regions 7 and 10. Therefore, its breakdown voltage is relatively low.

However, when the region 10 is formed apart from the region 7 by the distance *d* as shown in FUG. 6, the breakdown voltage across the junction J can be made high to a necessary extent by selecting the distance *d* suitably.

The region 10, to which the electrode 9 is connected, is surrounded by the channel stopper region 7 completely or formed therewithin in the example of FIG. 2, so that the depletion layer 20 extending outwardly from the collector junction $J_c$ together with its associating channel terminates at the channel stopper region 7 and does not reach the region 10. Similarly, the regions 10 in the examples of FIGS. 4, 5 and 6 are formed at the position at which the depletion layers 20 from the collector junction $J_c$ do not arrive.

If the depletion layer 20 from the collector junction $J_c$ reaches the region 10, it is affected by the base potential through the depletion layer 20 and hence can not keep an electrically floated condition substantially.

In order to determine the position of the region 10 practically, the width of the depletion layer 20 expanded by a voltage immediately before the breakdown voltage across the collector junction $J_c$ is obtained by the impurity concentrations of the semiconductor substrate the channel stopper region and so on, and then the region 10 is provided apart from the depletion layer 20.

Figure 7:
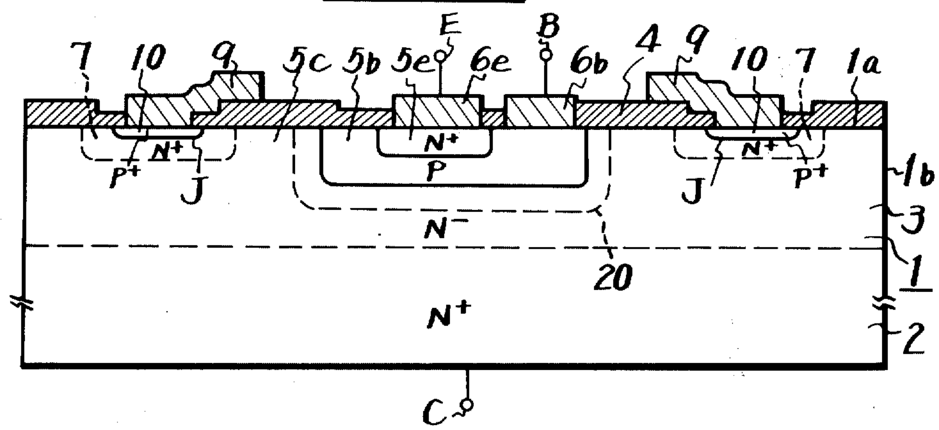

The above embodiments of the invention are the case that the present invention is adapted to the PNP-type transistors, but the present invention can be applied to an NPN-type transistor as shown in FIG. 7.

Figure 8:
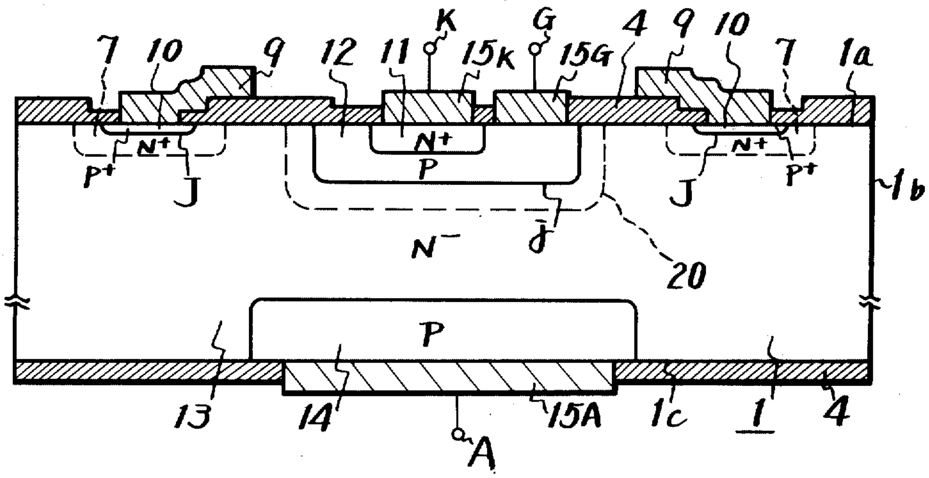

Further, it is no need to restrict the present invention to the above transistors but the present invention can be applied to, for example, a switching element of a NPNP-structure having a junction supplied with a reverse bias. FIG. 8 is a further embodiment of the invention, in which the invention is applied to a gate-turn-off type semiconductor controlled rectifier element which is required to be high in break-down voltage and small in leakage current. In this embodiment, a region 12 of P-type conductivity different from that of the silicon semiconductor body 1 is selectively formed on the major surface 1*a* of the semiconductor body 1 of relatively low impurity concentration of N-type conductivity by diffusion, and a region 11 of N-type conductivity different from that of the region 12 is formed in the region 12 by diffusion. Further, a region 14 of P-type conductivity different from that of the body 1 is selectively formed on the other major surface 1*c* of the body 1 by diffusion. In this case, the regions 11 and 12 act as first and second regions, an N-type region 13 made of the body 1 acts as a third region and the region 14 serves as a fourth region, respectively, to form the NPNP structure.

In FIG. 8, reference numerals 15U, 15G and 15A are cathode, gate (control) and anode electrodes which are formed in ohmic contact on the first, second and fourth regions, respectively. In the example of FIG. 8, the major surfaces 1*a* and 1*c* of the body 1 are coated with insulating layers 4 made of such, for example, silicon dioxide $SiO_2$. A junction *j* between the second and third regions 12 and 13 has a great influence on the characteristics of the element and hence the leakage current across the junction *j* and its break-down voltage become a problem. therefore, in the example of FIG. 8, the channel stopper region 7, the electrode 9 and the region 10, which serves to connect the electrode 9 to the substrate region or the third region 13, are formed on the major surface 1*a* of the body 1, to which major surface 1*a* the junction *j* is extended, to surround the outside of the surface of the junction *j*, similar to the above examples. The patterns and effects of the electrode 9 and the regions 7 and 10 are substantially similar to those of the examples shown in FIGS. 2 to 7, so that their description will be omitted for the sake of simplicity but the corresponding parts are indicated with the same reference numerals.

In the illustrated and described examples, the electrode 9 is connected to the region 5*c* or 13 through the PN junction J which serves as a rectifying barrier layer, but it may be possible that the electric 9 is connected to the region 5*c* or 13 through an electric barrier layer such as a Schottky varrier without being restricted to the above barrier layer by the PN-junction.

It may be apparent that many modifications and variations could be effected by one skilled in the art without departing from the spirits or scope of the novel concepts of the invention.

We claim as our invention:

1. A semiconductor device comprising:

a. a first semiconductor layer of one conductivity type having low impurity concentration;

b. a second semiconductor region of the opposite conductivity type forming a PN junction with said first semiconductor layer;

c. a third semiconductor region of said one conductivity type formed in said first semiconductor layer surrounding said PN junction, said third region having higher impurity concentration than that of said first layer;

d. a passivation layer covering at least said PN junctions; and e. a conductive layer extending on said passivation layer covering at least the inner periphery of said third semiconductor region and connected to said first semiconductor layer through a fourth region of said opposite conductivity type, said fourth region forming an electric barrier layer with said first and third regions.

2. A semiconductor device as claimed in claim 1, in which said first semiconductor layer serves as a collector, said second semiconductor region serves as a base, and an emitter is diffused in said base at the same time of diffusing said third semiconductor region in said first semiconductor layer to form a transistor.

3. A semiconductor device as claimed in claim 1, in which said electric barrier layer is a PN junction formed between said first semiconductor layer of one conductivity type and said fourth semiconductor region of the opposite conductivity type.

4. A semiconductor device as claimed in claim 1, in which said electric barrier layer is positioned apart from a PN junction between said first semiconductor layer and said second semiconductor region.

5. A semiconductor device as claimed in claim 1, in which said electric barrier layer is formed in said third semiconductor region.

6. A semiconductor device comprising:

a. a first semiconductor layer of one conductivity type having low impurity concentration;

b. a second semiconductor region of the opposite conductivity type forming a first PN junction with said first semiconductor layer;

c. a third semiconductor region of said one conductivity type having high impurity concentration formed in said first semiconductor region surrounding said first PN junction and forming a junction therewith;

d. a fouth semiconductor region of said opposite conductivity type formed in said third semiconductor region and forming a second PN junction therewith;

e. a passivation layer covering at least said first PN junction and said junction between said third region and said first region; and f. a conducting layer extending on said passivation layer covering at least the inner periphery of said third semiconductor region and connected to said first semiconductor layer through said fourth region, said fourth region forming a PN junction with said first region.

* * * * *